US006692989B2

(12) United States Patent
Miyaki et al.

(10) Patent No.: US 6,692,989 B2
(45) Date of Patent: *Feb. 17, 2004

(54) PLASTIC MOLDED TYPE SEMICONDUCTOR DEVICE AND FABRICATION PROCESS THEREOF

(75) Inventors: Yoshinori Miyaki, Tachikawa (JP); Hiromichi Suzuki, Machida (JP); Kazunari Suzuki, Tokyo (JP); Takafumi Nishita, Iruma (JP); Fujio Ito, Hanno (JP); Kunihiro Tsubosaki, Hino (JP); Akihiko Kameoka, Ogose-machi (JP); Kunihiko Nishi, Kokubunji (JP)

(73) Assignees: Renesas Technology Corporation, Tokyo (JP); Hitachi ULSI Systems, Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/371,275

(22) Filed: Feb. 24, 2003

(65) Prior Publication Data

US 2003/0124770 A1 Jul. 3, 2003

Related U.S. Application Data

(60) Continuation of application No. 09/832,008, filed on Apr. 11, 2001, now Pat. No. 6,558,980, which is a division of application No. 09/331,721, filed as application No. PCT/JP96/03808 on Dec. 26, 1996, now Pat. No. 6,291,273.

(51) Int. Cl.[7] ............................................... H01L 21/44

(52) U.S. Cl. .................. 438/112; 438/118; 438/123; 438/124; 438/127

(58) Field of Search ................................ 438/112, 118, 438/123, 124, 127

(56) References Cited

U.S. PATENT DOCUMENTS

| 5,197,183 A | 3/1993 | Chia et al. ..................... 29/827 |
| 5,327,008 A | 7/1994 | Djennas et al. ............. 257/666 |
| 5,358,906 A | 10/1994 | Lee ............................ 437/217 |

(List continued on next page.)

FOREIGN PATENT DOCUMENTS

| JP | 63-204753 | 8/1988 |
| JP | 63-228631 | 9/1988 |
| JP | 2-9142 | 1/1990 |
| JP | 6-132446 | 5/1994 |
| JP | 6-216303 | 8/1994 |
| JP | 8-204107 | 8/1996 |

*Primary Examiner*—Michael S. Lebentritt
*Assistant Examiner*—Christian D. Wilson
(74) *Attorney, Agent, or Firm*—Antonelli, Terry, Stout & Kraus, LLP

(57) ABSTRACT

A process is provided for the fabrication of a plastic molded type semiconductor device in which a die pad is formed to have a smaller area than a semiconductor chip to be mounted on a principal surface of the die pad and the semiconductor chip and die pad are sealed with a plastic mold. The semiconductor chip and the die pad are disposed within a cavity of a mold so that the clearance from the reverse surface of the die pad to the inside wall surface of the cavity opposite to the reverse surface of the die pad becomes narrower, by a length corresponding to the thickness of the die pad, than the clearance from the principal surface of the semiconductor chip to the inside wall surface of the cavity opposite to the principal surface of the semiconductor chip; and a resin is poured from a center gate into said cavity to form a plastic mold, which makes it possible to prevent said semiconductor chip from being lifted upwardly by the resin flowing in a filling region on the reverse surface side of the semiconductor chip. As a result, inconvenient shifting of the semiconductor chip, bonding wires and the like in the plastic mold can be prevented, leading to an increase in the yield of the plastic molded type semiconductor device.

8 Claims, 17 Drawing Sheets

U.S. PATENT DOCUMENTS

| | | | |
|---|---|---|---|
| 5,378,656 A | 1/1995 | Kajihara et al. | 437/217 |
| 5,459,103 A | 10/1995 | Kelleher et al. | 437/209 |
| 5,535,509 A | 7/1996 | Tomita et al. | 29/827 |
| 5,753,977 A | 5/1998 | Kusaka et al. | 257/787 |
| 5,939,775 A | 8/1999 | Bucci et al. | 257/667 |
| 6,046,507 A | 4/2000 | Hatchard et al. | 257/790 |
| 6,091,157 A | 7/2000 | Black et al. | 257/790 |
| 6,291,273 B1 * | 9/2001 | Miyaki et al. | 438/123 |
| 6,291,274 B1 | 9/2001 | Oida et al. | 438/123 |
| 6,355,502 B1 | 3/2002 | Kang et al. | 438/110 |
| 6,558,980 B2 * | 5/2003 | Miyaki et al. | 438/112 |
| 2001/0045644 A1 | 11/2001 | Huang | 257/718 |

* cited by examiner

PLASTIC MOLDED TYPE SEMICONDUCTOR DEVICE AND FABRICATION PROCESS THEREOF

This application is a Continuation application of application Ser. No. 09/832,008, now U.S. Pat. No. 6,558,980 filed Apr. 11, 2001, which is a Divisional application of application Ser. No. 09/331,721, filed Oct. 20, 1999, now U.S. Pat. No. 6,291,273 which is a national stage application filed under 35 USC 371 of PCT/JP96/03808, filed Dec. 26, 1996, the contents of said Ser. No. 09/331,721 being incorporated herein by reference in their entirety.

BACKGROUND OF THE INVENTION

The present invention relates to a plastic molded type semiconductor device; and, in particular, the invention relates to a plastic molded type semiconductor device fabricated by the transfer mold method and to a technique effective when applied to a process for the fabrication of the device.

A plastic molded type semiconductor device is fabricated by mounting a semiconductor chip on a chip mounting surface of a die pad (which is also called a tab) supported on the frame body of a lead frame through a supporting lead; electrically connecting an external terminal, which is disposed on the principal surface of the semiconductor chip, with an inner portion of the lead supported on the frame body of the lead frame through a bonding wire; sealing the semiconductor chip, die pad, supporting lead, inner portion of the lead, bonding wire and the like with a plastic mold; cutting the supporting lead and the outer portion of the lead from the frame body of the lead frame; and then forming the outer portion of the lead into a predetermined shape.

The plastic mold for the above-described plastic molded type semiconductor device is fabricated in accordance with a transfer mold method suited for mass production. Described specifically, a lead frame subjected to the preceding steps (die bonding step and wire bonding step) is disposed between the top portion and the bottom portion of a mold and, at the same time, within the cavity of the mold, a semiconductor chip, die pad, supporting leads and inner portions of the leads and bonding wires are arranged. Then, a resin is poured under pressure into the cavity from a pot of the mold through its runner and gate, whereby a plastic mold can be prepared.

In the fabrication step of the above-described plastic mold, with a view toward avoiding a failure to completely fill the cavity, in other words, for suppressing the generation of a void, there has been an attempt to make the fluidity of the resin flowing into the filling region 11A on the principal surface side of the semiconductor chip 2 equal to the fluidity of the resin flowing into the filling region 11B on the reverse surface side of the semiconductor chip 2 by arranging the semiconductor chip 2 and the die pad 3A within the cavity 11, as illustrated in FIG. 16 (a schematic cross-sectional view), so as to make a clearance L2 from the principal surface of the semiconductor chip 2 to the inside wall surface of the cavity 11 opposite to the principal surface equal to a clearance L2 from the reverse surface of the die pad 3A to the inside wall surface of the cavity 11 opposite to the reverse surface. In addition, there has also been an attempt to cause the resin to flow simultaneously into the filling region 11A on the principal surface side of the semiconductor chip 2 and the filling region 11B on the reverse surface side by adopting, as a gate for controlling the amount of the resin poured into the cavity 2, a center gate 12 (which will also be called a "vertical gate") extending above and below the lead frame 3.

In the above-described plastic molded semiconductor device, the die pad, together with the semiconductor chip, is sealed with the plastic mold so that water contained in the plastic mold tends to be collected on the reverse surface of the die pad. Water collected on the reverse surface of the die pad vaporizes and expands in response to the heat generated during a temperature cycle test, which is an environmental test effected after the completion of the product, or the heat generated upon packaging, and becomes a cause for the generation of cracks (package cracks) in the plastic mold.

With a view toward overcoming such technical problems, Japanese Patent Laid-Open No. SHO 63-204753 discloses a technique for making the area of a die pad smaller than that of a semiconductor chip, by which technique, the phenomenon causing water contained in the resin of a plastic mold to be collected on the reverse surface of the die pad can be suppressed. Thus, cracks (package cracks) in the plastic mold caused by vaporization and expansion of the water contained on the reverse surface of the die pad can be prevented.

As illustrated in FIG. 17 (a schematic cross-sectional view), when the area of a die pad 3A is made smaller than that of a semiconductor chip 2, a filling region 11B on the reverse surface side of the semiconductor chip 2 becomes wider in proportion, which makes the fluidity of a resin flowing in the filling region 11B on the reverse surface side of the semiconductor chip 2 to be higher than that flowing in the filling region 11A on the principal surface side of the semiconductor chip 2. In other words, the filling of the resin into the filling region 11B on the reverse surface side of the semiconductor chip 2 is completed earlier than that flowing into the filling region 11A on the principal surface side of the semiconductor chip 2. As illustrated in FIG. 18 (a schematic cross-sectional view), a resin 1A flowing in the filling region 11B on the reverse surface side of the semiconductor chip 2 lifts the semiconductor chip 2 upwardly and causes an inconvenient shifting of the semiconductor chip 2, bonding wire and the like from the plastic mold, leading to a marked reduction in the yield of the plastic molded type semiconductor device.

In the resin molded type semiconductor device adopting a QFP structure, on the other hand, supporting leads are arranged in the outside region at the corner of a semiconductor chip, while a plurality of leads and a plurality of bonding wires are arranged in the outside region on each side of the semiconductor chip. In other words, the outside region at the corner of the semiconductor chip is coarser than the outside region on each side of the semiconductor chip so that the fluidity of the resin is higher in the outside region at the corner of the semiconductor chip than it is in the outside region on each side of the semiconductor chip. Accordingly, the bonding wire tends to move owing to the resin flowing into the outside region on each side of the semiconductor chip from the outside region at the corner, and a short circuit occurs between two adjacent bonding wires, which brings about a marked deterioration in the yield of the plastic molded type semiconductor device. The short circuit between these bonding wires is particularly marked between a bonding wire connected to a first-stage lead most closely adjacent to the outside region at the corner of the semiconductor chip and a bonding wire connected to a second-stage lead adjacent to the first lead.

An object of the present invention is to provide a technique which can increase the yield of a plastic molded type semiconductor device.

Another object of the present invention is to provide a technique which can heighten the yield in the fabrication process of a plastic molded type semiconductor device.

The above-described and the other objects and novel features of the present invention will be apparent from the following description and accompanying drawings.

SUMMARY OF THE INVENTION

Typical aspects of the invention as disclosed in this application will next be summarized briefly.

(1) A process for the fabrication of a plastic mold semiconductor device in which a die pad is formed to have a smaller area than a semiconductor chip mounted on a principal surface of the die pad and the semiconductor chip and die pad are sealed with a plastic mold, which comprises a step of mounting the semiconductor chip on the principal surface of the die pad supported onto a frame body of a lead frame through supporting leads; a step of arranging said lead frame between the top portion and the bottom portion of a mold and arranging, in a cavity of the mold, the semiconductor chip and die pad so that a clearance from the reverse surface side of the die pad to the inside wall surface of the cavity opposite to the reverse surface side of the die pad becomes narrower, by the thickness of the die pad, than a clearance from the principal surface of the semiconductor chip to the inside wall surface of the cavity opposite to the principal surface of the semiconductor chip; and a step of pouring a resin from a gate of said mold positioned on one side of said semiconductor chip. It further comprises using as the gate of the mold, a center gate extending above and below the lead frame and pouring the resin into the upper and lower portions of the cavity simultaneously, thereby forming a plastic mold.

(2) A plastic molded type semiconductor device in which a plurality of external terminals are arranged on and along at least one side of the principal surface of a semiconductor chip, a plurality of leads are arranged outside and along one side of said semiconductor chip, each of the plurality of external terminals is electrically connected with one end portion of each of said plurality of leads through a bonding wire, and the semiconductor chip, leads and bonding wires are sealed with a resin. In this plastic molded type semiconductor device, at least the distance between an end portion of a first-stage lead most closely adjacent to a corner of said semiconductor chip and a second-stage lead adjacent to the first-stage lead is formed to be wider than the distance of the other two leads at one end portion.

According to the item (1), the filling region on the principal surface side of the semiconductor chip has substantially the same volume as that of the filling region on the reverse surface side, each region being disposed within the cavity, whereby the fluidity of the resin flowing through the filling region on the principal surface side of the semiconductor chip can be made almost equal to that of the resin flowing through the filling region on the reverse surface side. Furthermore, the adoption of the center gate makes it possible to supply resin to the filling region on the principal surface side of the semiconductor chip and the filling region on its reverse surface side simultaneously. Accordingly, the filling of resin into the filling region on the principal surface side of the semiconductor chip and the filling of resin into the filling region on the reverse surface side can be completed almost at the same time, which makes it possible to prevent the semiconductor chip from being lifted upwardly by the resin supplied to the filling region on the reverse surface side of the semiconductor chip. As a result, an inconvenient shifting of the semiconductor chip, bonding wires and the like in the plastic mold can be prevented and the yield of the plastic molded type semiconductor device can be heightened.

According to the above-described item (2), since the clearance between a bonding wire connected to one end portion of the first-stage lead most closely adjacent to the outside region of the corner portion of the semiconductor chip and another bonding wire connected to one end portion of the second-stage lead adjacent to the first-stage lead can be formed wider, even if the boding wire moves owing to the resin flowing into the outside region on one side of the semiconductor chip from the outside region at the corner of the semiconductor chip, the generation of a short circuit between these bonding wires can be suppressed. As a result, the yield of the plastic molded type semiconductor device can be heightened.

DESCRIPTION OF THE EMBODIMENTS

Figure 1:
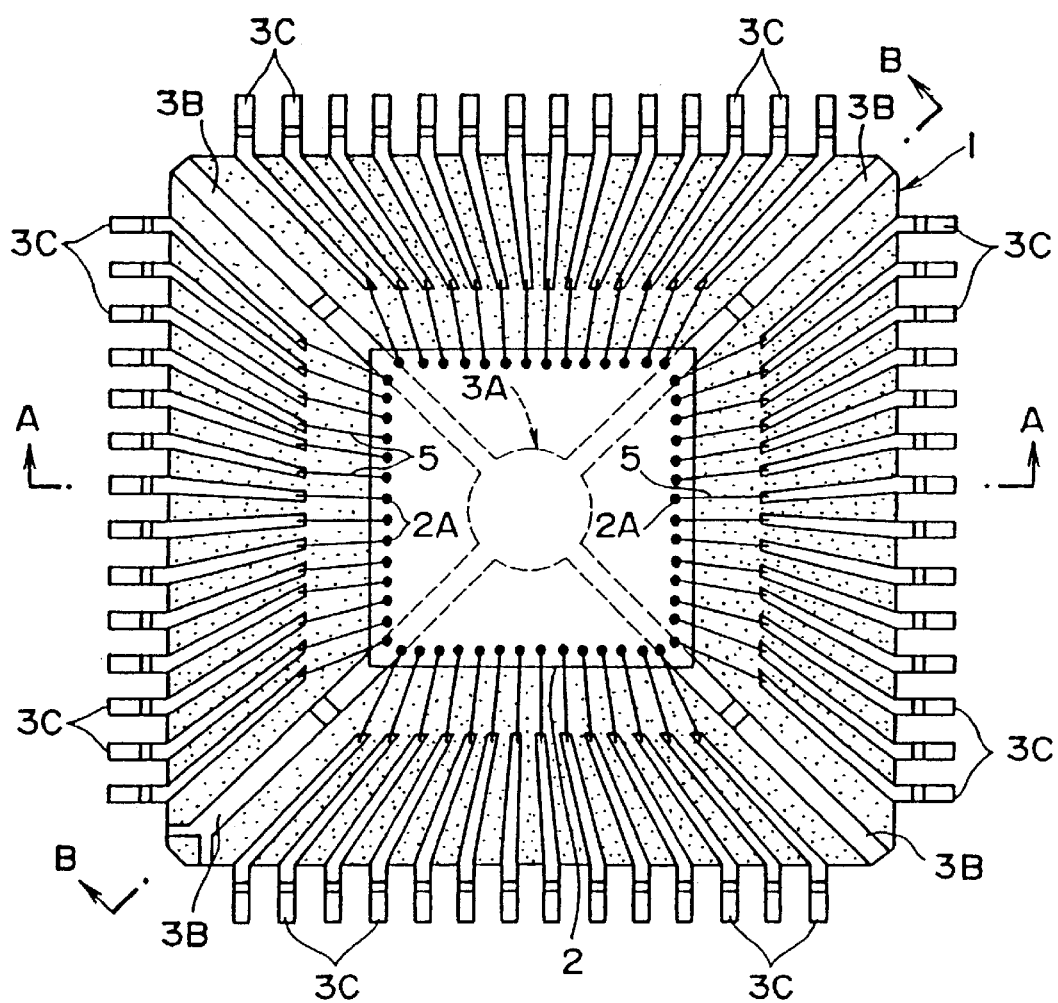
FIG. 1 is a plan view a plastic molded type semiconductor device according to a first embodiment of the present invention from which the upper portion of a plastic mold has been removed.

The constitution of the present invention will hereinafter be described with reference to various embodiments.

In the drawings illustrating the several embodiments, like elements having the same function will be identified by like reference numerals and overlapping descriptions thereof will be omitted.

(First Embodiment)

Figure 2:
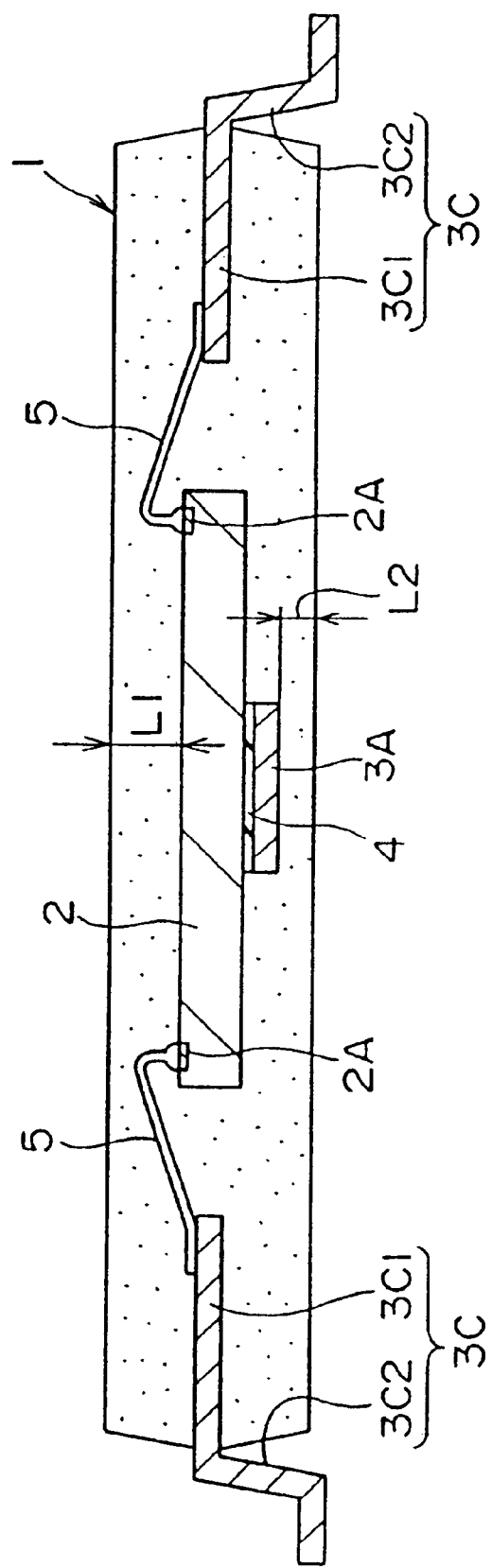
FIG. 2 is a cross-sectional view taken along line A—A of FIG. 1.

In the plastic molded type semiconductor device according to this embodiment, a semiconductor chip 2 is mounted on a chip mounting surface (principal surface) of a die pad 3A as illustrated in FIGS. 1 and 2.

The semiconductor chip 2 has a planar shape, for example, a square plane having an outside dimension of 9 [mm]×9 [mm]. It is, for example, formed mainly of a semiconductor substrate made of single crystal silicon and an interconnection layer formed on the principal surface of the substrate.

On the semiconductor chip 2, for example, a logic circuit system, or a mixed circuit system having a logic circuit system and a memory circuit system in combination, is mounted. Besides, on the principal surface of the semiconductor chip 2, a plurality of external terminals (bonding pads) 2A are arranged along each side of the principal surface. Each of these external terminals 2A is formed on the top interconnection layer among the interconnection layers of the semiconductor chip 2, and is formed of an aluminum (Al) film or aluminum alloy film.

Outside of the semiconductor chip 2, a plurality of leads 3C are arranged along each side. Each of the respective inner portions 3C1 of these plurality of leads 3C is electrically connected, through a bonding wire 5, with each of the plurality of external terminals 2A arranged on the principal surface of the semiconductor chip 2.

As the bonding wire 5, a gold (Au) wire is used by way of example. Alternatively, a wire having a metal wire, such as an aluminum (Al) wire or copper (Cu) wire covered with an insulating resin, may be used. The connection of the bonding wire 5 is effected by the bonding method using thermo-compression bonding and ultrasonic vibration in combination.

To the die pad 3A, four supporting leads 3B are coupled. Each of these four supporting leads 3B serves to support the die pad 3A onto a frame body of the lead frame under the condition of the lead frame. The four supporting leads 3B support the die pad 3A at four points thereof so as to form a character X with the die pad 3A as an intersection. The width of the supporting lead 3B is set, for example, to 0.4 [mm].

The semiconductor chip 2, die pad 3A, supporting leads 3B, inner portions 3C1 of leads 3C and bonding wires 5 and the like are sealed with a plastic mold 1 formed by the transfer mold method. The plastic mold 1 is formed, for example, of a biphenyl resin to which a phenol hardener, silicone rubber, filler and the like is added in order to lower the stress. The transfer mold method is a method of forming a plastic mold by using a mold equipped with a pot, a runner, a gate, a cavity and the like and pouring a resin into the cavity from the pot through the runner and gate under pressure.

The planar shape of the plastic mold 1 is, for example, a square shape having an outside dimension of 14 [mm]×14 [mm]. Outside of the plastic mold 1 on each side thereof, outer portions 3C2 of a plurality of leads 3C are arranged. The outer portions 3C2 of the plurality of leads 3C are arranged along each side of the plastic mold 1, for example, in the form of a gull-wing. In short, the plastic mold semiconductor device according to this embodiment is fabricated to have a QFP (Quad Flat Package) structure.

The planar shape of the die pad 3A is, for example, in a circular form having an outside dimension of 2 to 4 [mm]φ. In other words, the die pad 3A according to this embodiment is formed to have a smaller area than that of the semiconductor chip 2. By forming the die pad 3A to have a smaller area than that of the semiconductor chip 2, the phenomenon in which the water, which is contained in the resin of the plastic mold 1, is collected on the reverse surface side of the die pad 3A can be suppressed, leading to the prevention of cracks in the plastic mold 1 caused by vaporization and expansion of the water.

In the step of fabricating the plastic mold 1, even if the middle portion of the bonding wire 5 hangs down, the contact of the die pad 3A with the bonding wire 5 can be prevented, because the die pad 3A does not extend outside of the outer periphery of the semiconductor chip 2. The longer the bonding wire 5 is, the more the middle portion of the bonding wire 5 hangs down.

On the other hand, when the area of the semiconductor chip 2 is reduced to that of the die pad 3A, the die pad 3A does not extend outside of the outer periphery of the semiconductor chip 2. Accordingly, even if the middle portion of the bonding wire 5 hangs down, the die pad 3A is not brought into contact with the bonding wire 5 so that a semiconductor chip 2 having a different outside dimension can be accommodated.

The central region of the reverse surface opposite to the principal surface of the semiconductor chip 2 is adhered and fixed to the chip mounting surface of the die pad 3A through an adhesive 4. The adhesive 4 is composed of, for example, an epoxy-based silver (Ag) paste material. The adhesive 4 is applied, in the bonding step of the semiconductor chip 2, to the chip mounting surface of the die pad 3A by a multi-point coating method.

Figure 3:
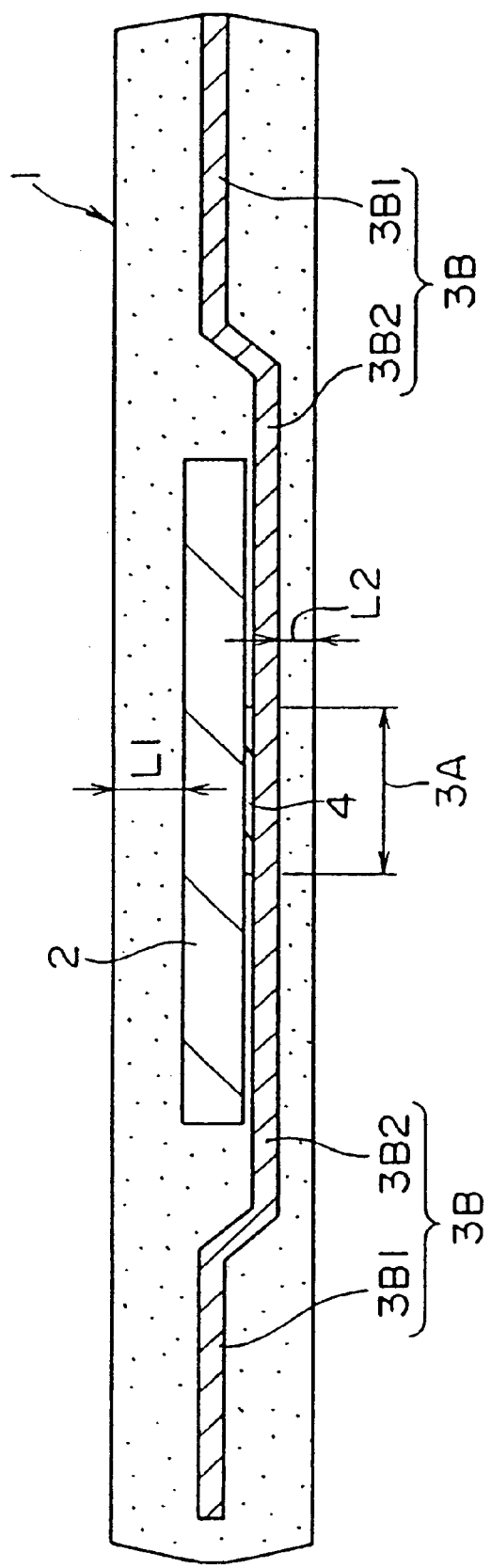
FIG. 3 is a cross-sectional view taken along line B—B of FIG. 1.

The supporting lead 3B is, as illustrated in FIG. 3, formed of a lead portion 3B1 and a lead portion 3B2. The lead portion 3B1 is disposed at the same position, in the thickness direction (vertical direction) of the mold, as that of the inner portion 3C1 of the lead 3C illustrated in FIG. 2, while the lead portion 3B2 is disposed at the same position, in the thickness direction (vertical direction) of the mold, as that of the die pad 3A. In the plastic molded type semiconductor device according to this embodiment, the chip mounting surface of the die pad 3A is lowered in the thickness direction of the mold from the upper surface (bonding surface) of the inner portion 3C1 of the lead 3C.

In the plastic mold 1, as illustrated in FIG. 2 and FIG. 3, the thickness L1 of the resin on the principal surface of the semiconductor chip 2 is greater, by an amount corresponding to the thickness of the die pad 3A, than the thickness L2 of the resin on the reverse surface of the die pad 3A. In other words, the semiconductor chip 2 is disposed nearly at the center of the plastic mold 1 in the thickness direction of the plastic mold 1.

Figure 4:
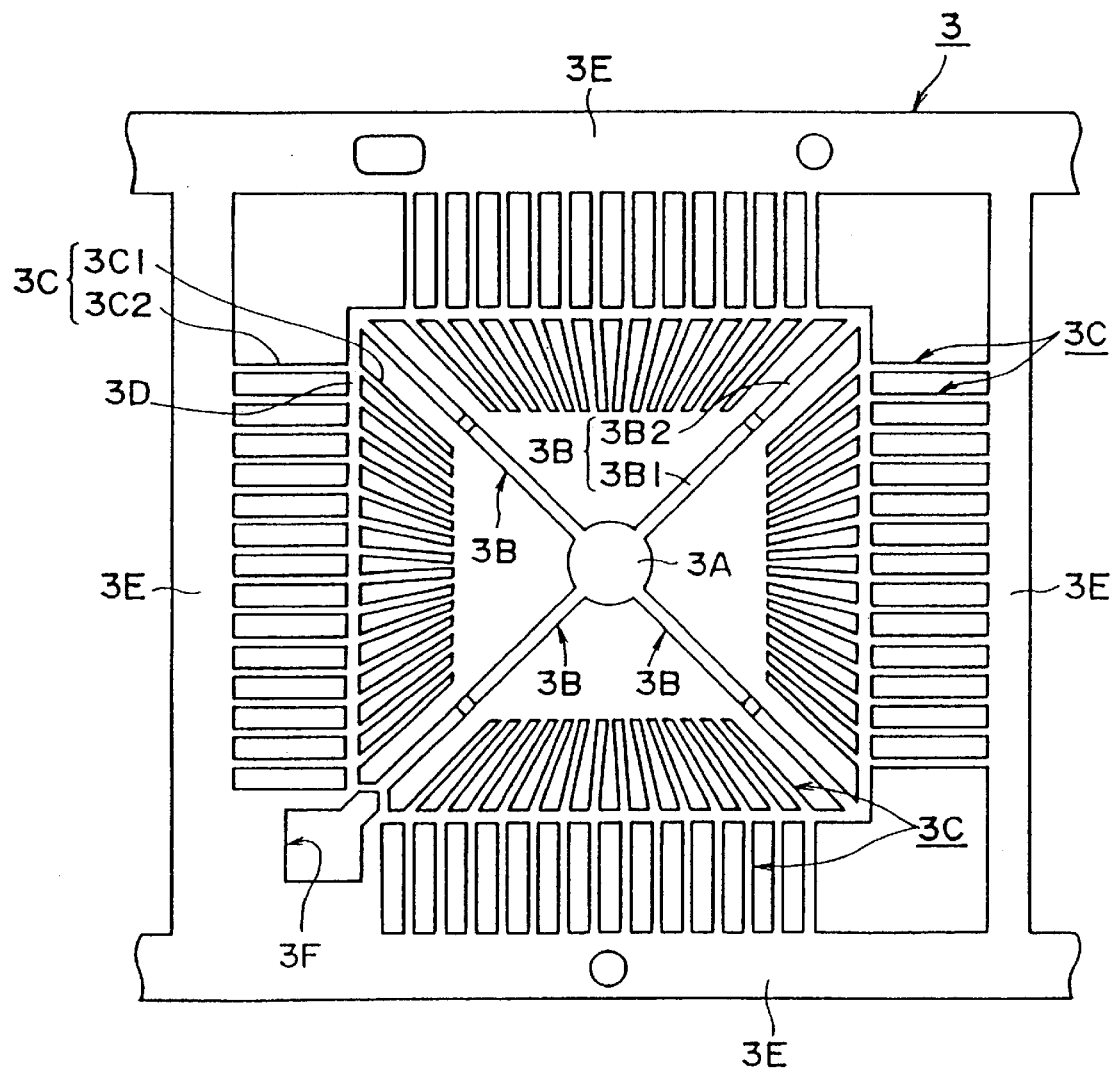
FIG. 4 is a plan view of a lead frame used for the fabrication of the above-described plastic molded type semiconductor device.

The plastic molded type semiconductor device having the above-described constitution is fabricated by a process using a lead frame 3 as illustrated in FIG. 4.

The lead frame 3 has a die pad 3A, four supporting leads 3B, a plurality of leads 3C and the like, each arranged within a region defined by the frame body 3E. The die pad 3A is coupled to the frame body 3E through the four supporting leads 3B. The plurality of the leads 3C are connected with the frame body 3E, and, at the same time, are connected through a tie bar (dam bar) 3D to each other.

The lead 3C is formed of an inner portion 3C1 to be sealed with the plastic mold 1 and an outer portion 3C2 formed into a predetermined shape. The supporting lead 3B is formed of the lead portion 3B1 and the lead portion 3B2. The lead portion 3B1 is disposed at the same position in the thickness direction (vertical direction) of the mold as that of the inner portion 3C1 of the lead 3C, while the lead portion 3B2 is disposed at the same position in the thickness direction (vertical direction) of the mold as that of the die pad 3A.

The lead frame 3 is composed of, for example, an iron (Fe)-nickel (Ni) based alloy, copper (Cu) or copper based alloy. This lead frame is formed by etching or pressing a plate material into a predetermined pattern, followed by pressing the supporting lead 3B.

In the vicinity of the region where the supporting leads 3B are connected to the frame body 3E of the lead frame 3, a penetration hole 3F is formed for the injection of the resin. This penetration hole 3F serves to divide the flow of the resin, which has been supplied from the pot of the mold through the runner, into two streams, that is, streams which flow above and below the lead frame 3during the fabrication of the plastic mold 1.

The smaller the outer dimension of the die pad 3A, the longer the supporting leads 3B become, which makes it easy to move the die pad 3A in the vertical direction.

Moreover, with an increase in the number of pins, the supporting leads 3B becomes narrower and the die pad 3A can be moved more easily in the vertical direction. Further, the thinner will be the plastic mold 1, the thinner the supporting leads 3B, which makes it easy to move the die pad 3A in the vertical direction.

A description will next be made of the fabrication method of the above-described plastic molded type semiconductor device.

First, a lead frame 3 as illustrated in FIG. 4 is prepared.

Then, an adhesive 4 is applied by a multi-point coating method onto a chip mounting surface (principal surface) of a die pad 3A supported onto a frame body 3E of the lead frame 3 through supporting leads 3B.

On the chip mounting surface of the die pad 3A, a semiconductor chip 2 is mounted through the adhesive 4. The semiconductor chip 2 is adhered and thereby fixed onto the chip mounting surface of the die pad 3A through the adhesive 4.

External terminals 2A of the semiconductor chip 2 are electrically connected with inner portions 3C1 of the lead 3C supported on the frame body of the lead frame 3 through bonding wires 5.

Figure 5:
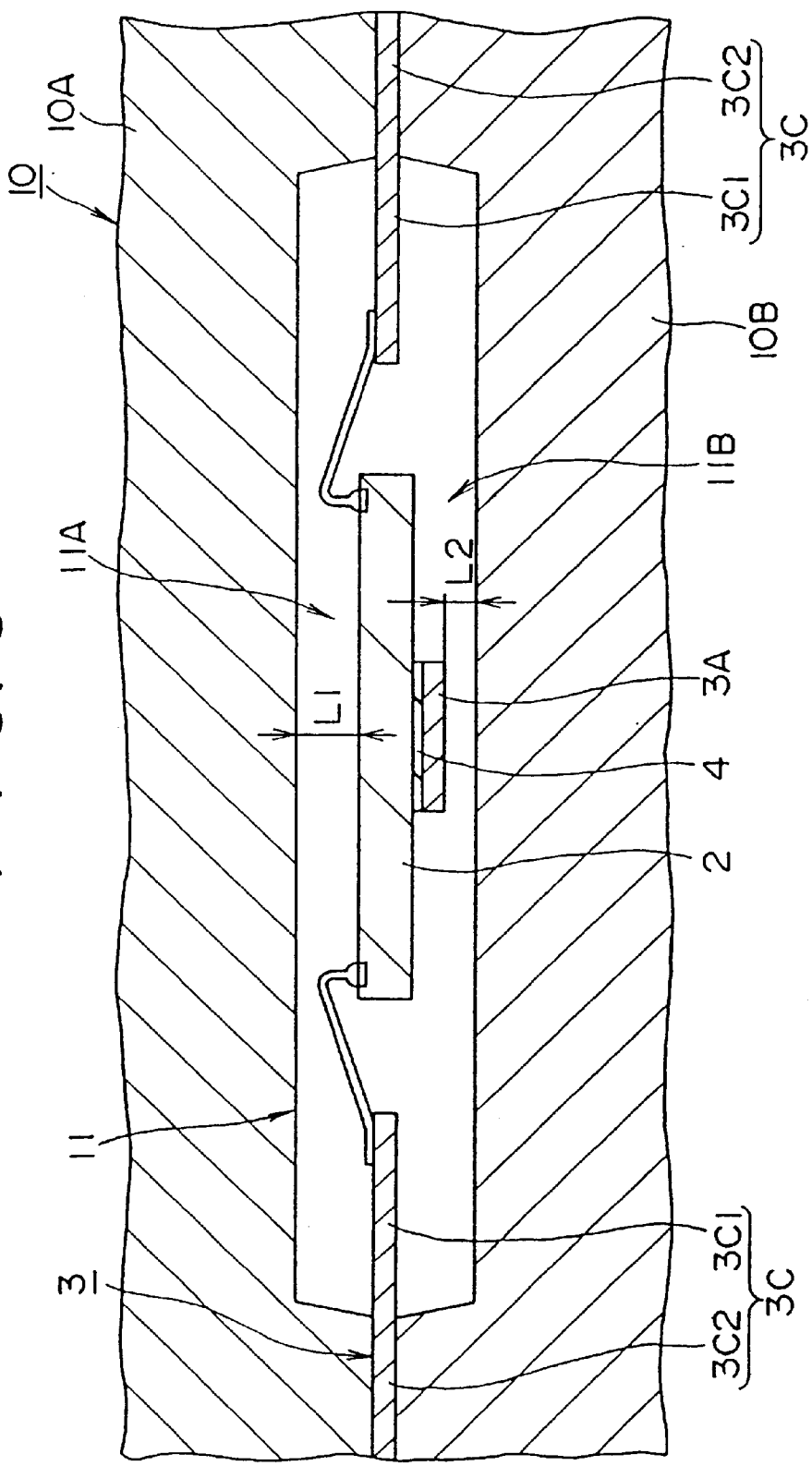
FIG. 5 is a fragmentary cross-sectional view for illustrating the process for the fabrication of the above-described plastic molded type semiconductor device.
Figure 6:
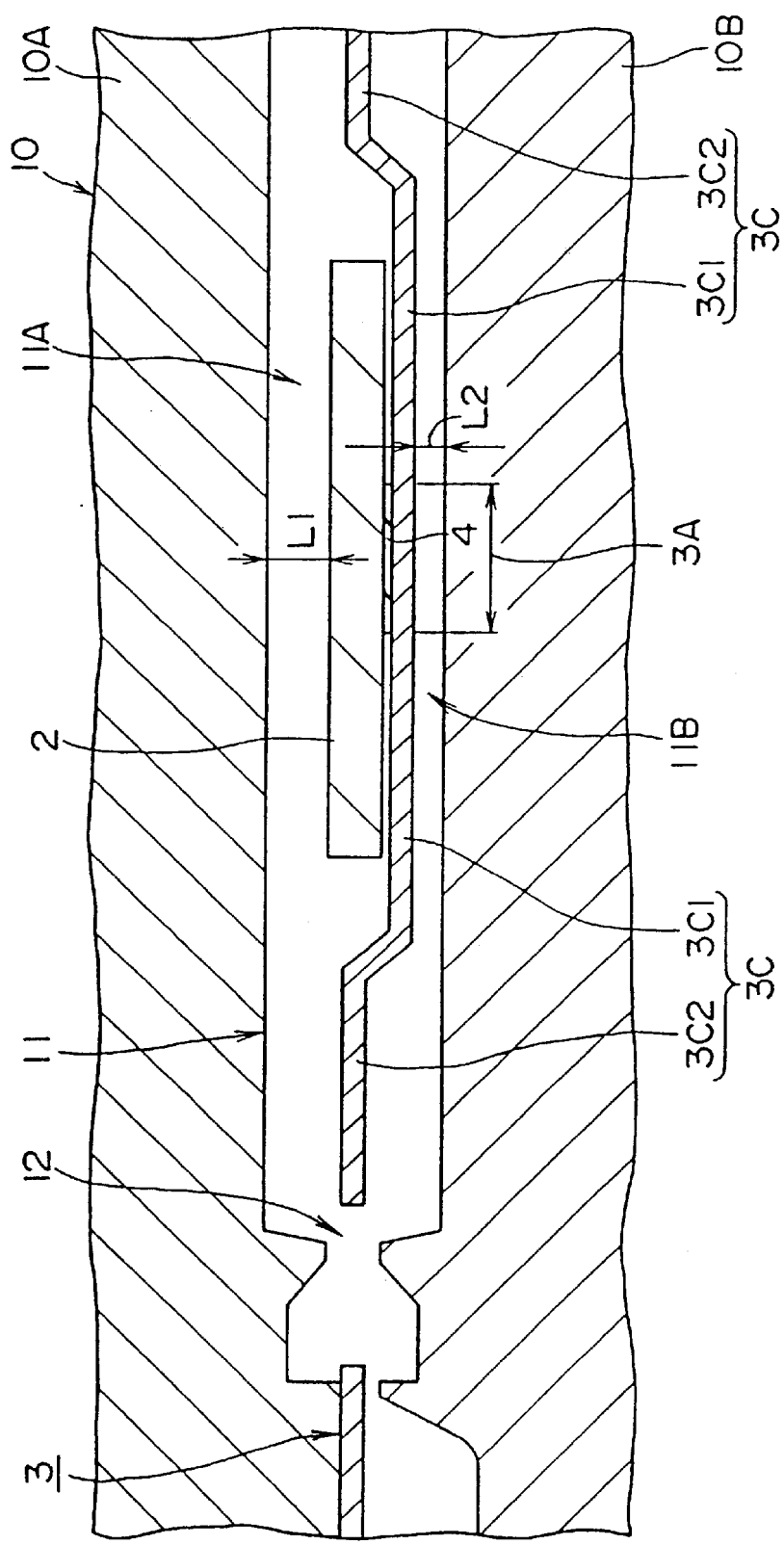
FIG. 6 is another fragmentary cross-sectional view for illustrating the process for the fabrication of the above-described plastic molded type semiconductor device.

As illustrated in FIGS. 5 and 6, the lead frame 3 is disposed between a top portion 10A and a bottom portion 10B of a mold 10 and at the same time, within a cavity 11 of the mold 10, the semiconductor chip 2 and the die pad 3A are disposed in such a way that the clearance L2 from the reverse surface side of the die pad 3A to the inside wall surface of the cavity 11 opposite to the reverse surface side becomes narrower, by a length corresponding to the thickness of the die pad 3A, than the clearance L1 from the principal surface of the semiconductor chip 2 to the inside wall surface of the cavity 11 opposite to the principal surface. By disposing the semiconductor chip 2 and the die pad 3A in such a way that the clearance L2 from the reverse surface of the die pad 3A to the inside wall surface of the cavity 11 opposite to the reverse surface becomes narrower, by a length corresponding to the thickness of the die pad 3A, than the clearance L1 from the principal surface of the semiconductor chip 2 to the inside wall surface of the cavity opposite to the principal surface, a filling region 11A on the principal surface side of the semiconductor chip 2 has almost the same volume as a filling region 11B on the reverse surface side, whereby the fluidity of the resin flowing in the filling region 11A on the principal surface side of the semiconductor chip 2 can be made almost equal to that of the resin flowing through the filling region 11B on the reverse surface side.

Incidentally, in the cavity 11, supporting leads 3B, inner portions 3C1 of leads 3C, bonding wires 5 and the like are disposed, as well as the semiconductor chip 2 and the die pad 3A. The mold 10 is equipped with, in addition to the cavity 11, a pot, a runner and a center gate 12. The center gate 12 communicates with the areas above and below the lead frame 3 so that a resin can be supplied simultaneously to the filling region 11A on the principal surface side of the semiconductor chip 2 disposed within the cavity 11 and the filling region 11B on the reverse surface side of the semiconductor chip. The center gate 12 is disposed in the vicinity of the region where the supporting leads 3B are connected with the frame body 3E of the lead frame 3.

Figure 7:
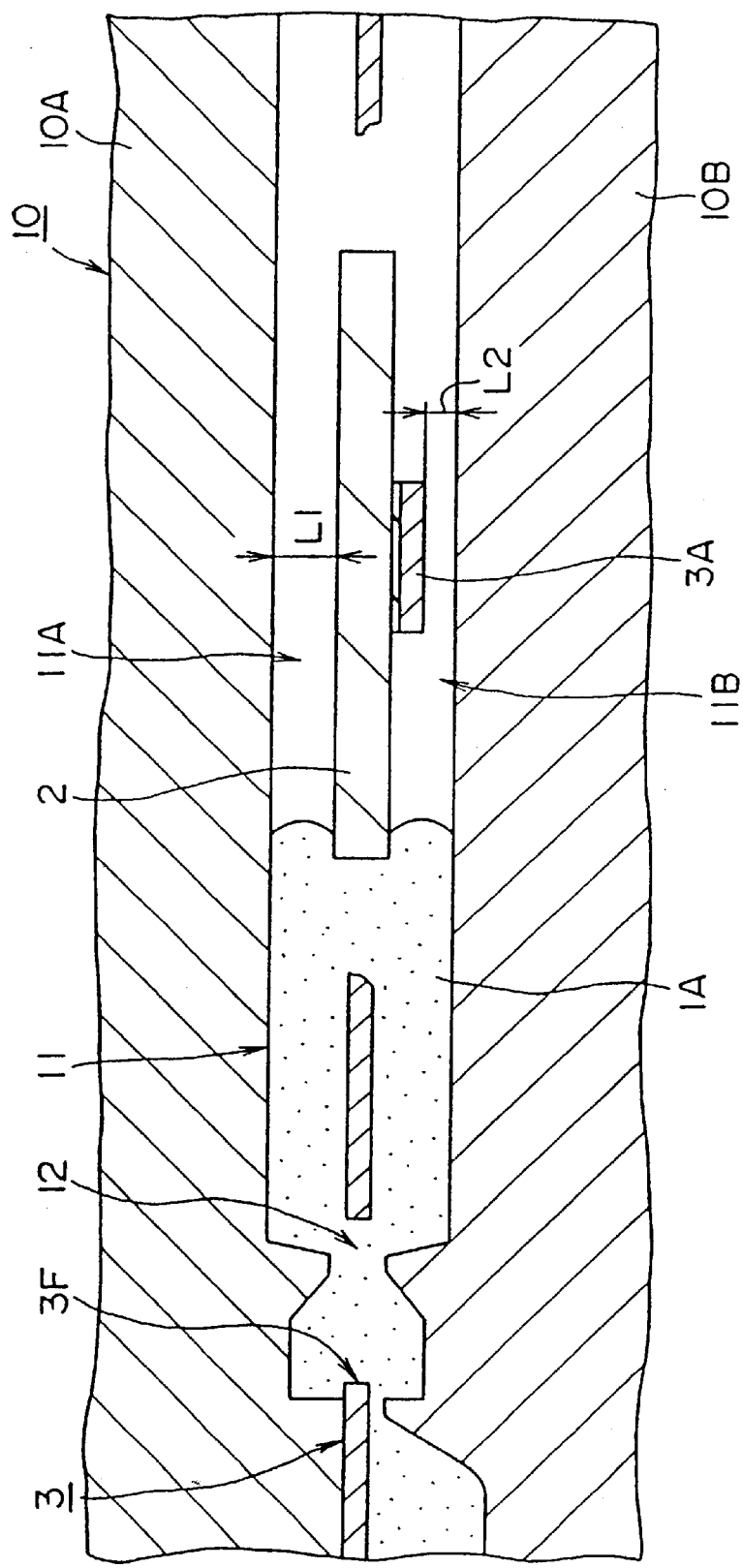
FIG. 7 is a schematic cross-sectional view for illustrating the flow of a resin.
Figure 8:
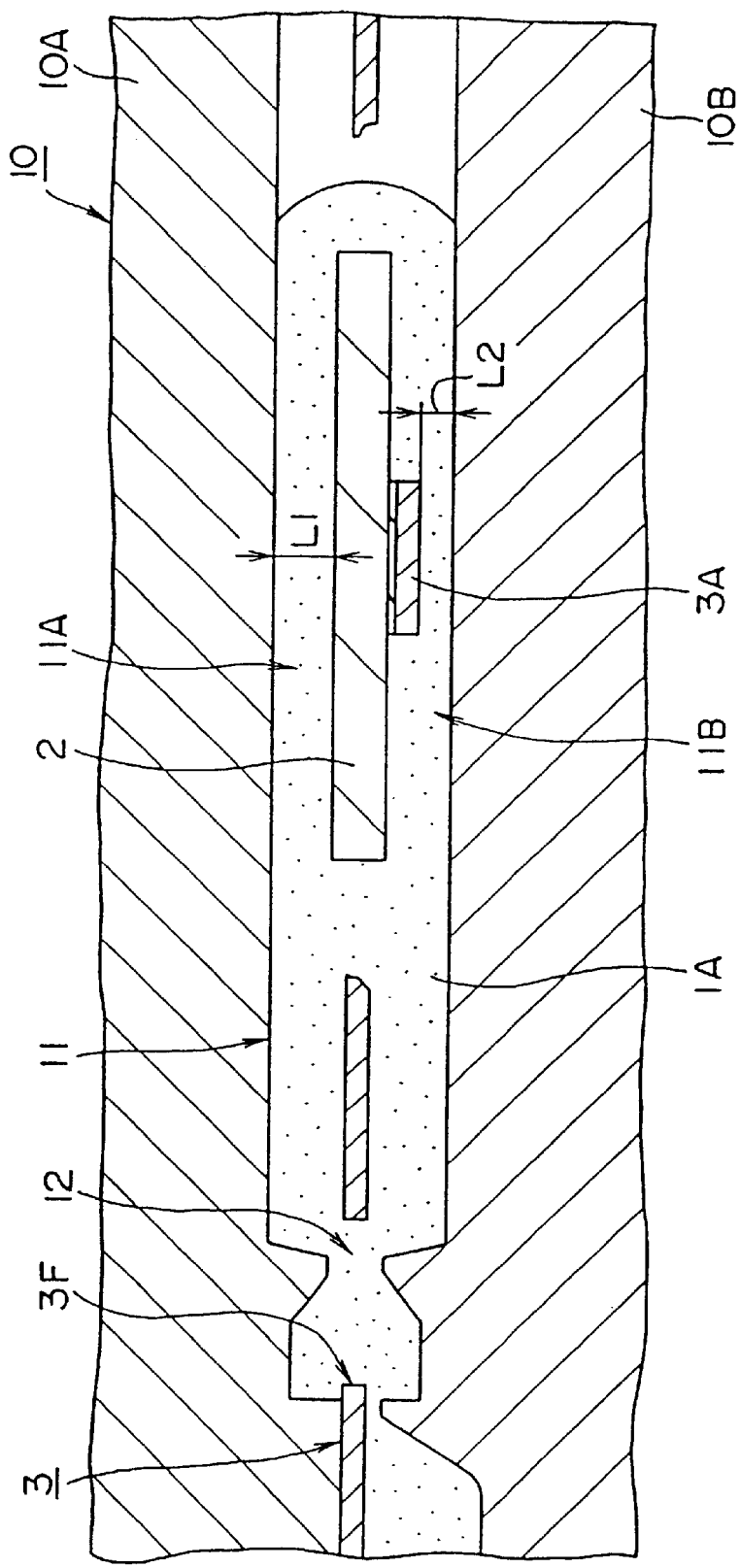
FIG. 8 is another schematic cross-sectional view for illustrating the flow of a resin.

Then, a plastic mold 1 is formed by pouring a resin, under pressure, into the cavity 11 through the center gate 12, which communicates with the areas above and below the lead frame 3. The resin is supplied to the center gate 12 from the pot of the mold 10 through the runner. FIGS. 7 and 8 illustrate the flow of the resin in this step. The resin 1A injected from the center gate 12 is fed almost simultaneously to the filling region 11A on the principal surface side of the semiconductor chip 2 and the filling region 11B on its reverse surface side. The filling of the filling region 11A and the filling of the filling region 11B with resin 1A are completed almost at the same time, as illustrated in FIG. 8. In other words, the semiconductor chip 2 is not lifted upwardly by the resin 1A flowing under pressure in the filling region 11A on the reverse surface side of the semiconductor chip 2.

The plastic molded type semiconductor device, as illustrated in FIGS. 1, 2 and 3, is substantially completed by cutting the supporting leads 3B and outer portions 3C2 of the leads 3C from the frame body 3E of the lead frame 3 and then forming the outer portions 3C2 of the leads 3C into a gull-wing shape.

As described above, in accordance with this embodiment, a process is employed for the fabrication of the plastic molded type semiconductor device in which the die pad 3A is formed to be smaller in area than the semiconductor chip 2 to be mounted on the principal surface thereof, and the semiconductor chip 2 and die pad 3A are sealed in a plastic mold 1. It comprises a step of mounting the semiconductor chip 2 on the principal surface of the die pad 3A supported onto the frame body 3E of the lead frames 3 through the supporting leads 3B; a step of disposing the lead frame 3 between the top portion 10A and the bottom portion 10B of the mold 10; a step of disposing the semiconductor chip 2 and the die pad 3A so that the clearance L2 from the reverse surface of the die pad 3A to the inside wall surface of the cavity 11 opposite to the reverse surface becomes narrower, by a length corresponding to the thickness of the die pad 3A, than the clearance L1 from the principal surface of the semiconductor chip 2 to the inside wall surface of the cavity 11 opposite to it's the principal surface; and a step of pouring a resin into the cavity 11 from one side of the semiconductor chip. Furthermore, the resin pouring step comprises a step of pouring the resin into the cavity 11 through the center gate 12, which communicates with the areas above and below the lead frame 3, thereby forming the plastic mold 1.

According to the above-described process, the filling region 11A on the principal surface side of the semiconductor chip 2 disposed in the cavity 11 is made substantially equal in volume to that of the filling region 11B on the reverse surface side, whereby the fluidity of the resin flowing through the filling region 11A on the principal surface side of the semiconductor chip 2 can be made almost equal to that of the resin flowing through the filling region 11B on its reverse surface side. The adoption of the center gate 12 makes it possible to supply the resin to the filling region 11A on the principal surface side and the filling region 11B on the reverse surface side simultaneously. Accordingly, the filling of the region 11A on the principal surface side of the semiconductor chip 2 and the filling of the region 11B on the reverse surface side 2 can be completed almost at the same time, which prevents the semiconductor chip 2 from being lifted upwardly by the resin flowing in the filling region on the reverse surface side of the semiconductor chip 2. As a result, inconvenient shifting of the semiconductor chip 2, bonding wires 5 and the like from the plastic mold 1 can be prevented and the yield of the plastic molded type semiconductor device can be heightened.

By disposing the die pad 3A lower, in the thickness direction of the plastic mold, than the inner portions 3C1 of the leads 3C supported by the frame body 3E of the frame 3, the fluidity of the resin flowing in the filling region 11A on the principal surface side of the semiconductor chip 2 can be made substantially equal to that of the resin flowing in the filling region 11B on the reverse surface side.

Figure 9:
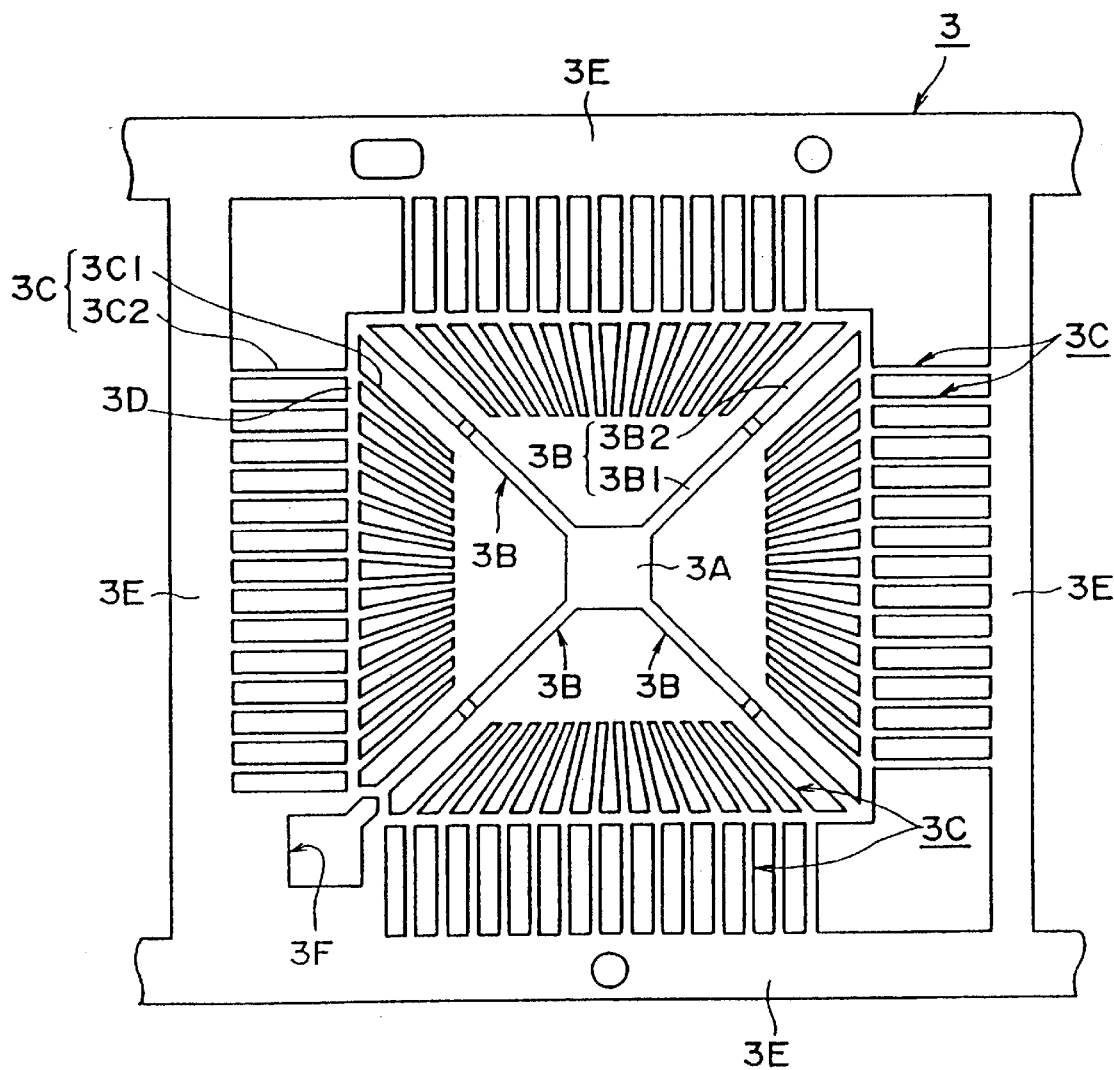
FIG. 9 is a plan view of another lead frame to be used for the fabrication of the above-described plastic molded type semiconductor device.

Incidentally, the plastic molded type semiconductor device may be prepared, as illustrated in FIG. 9, by a fabrication process using a lead frame 3 having a die pad 3A formed to have a square plane. Similar advantages can be obtained by this process employing such a lead frame 3.

Figure 10:
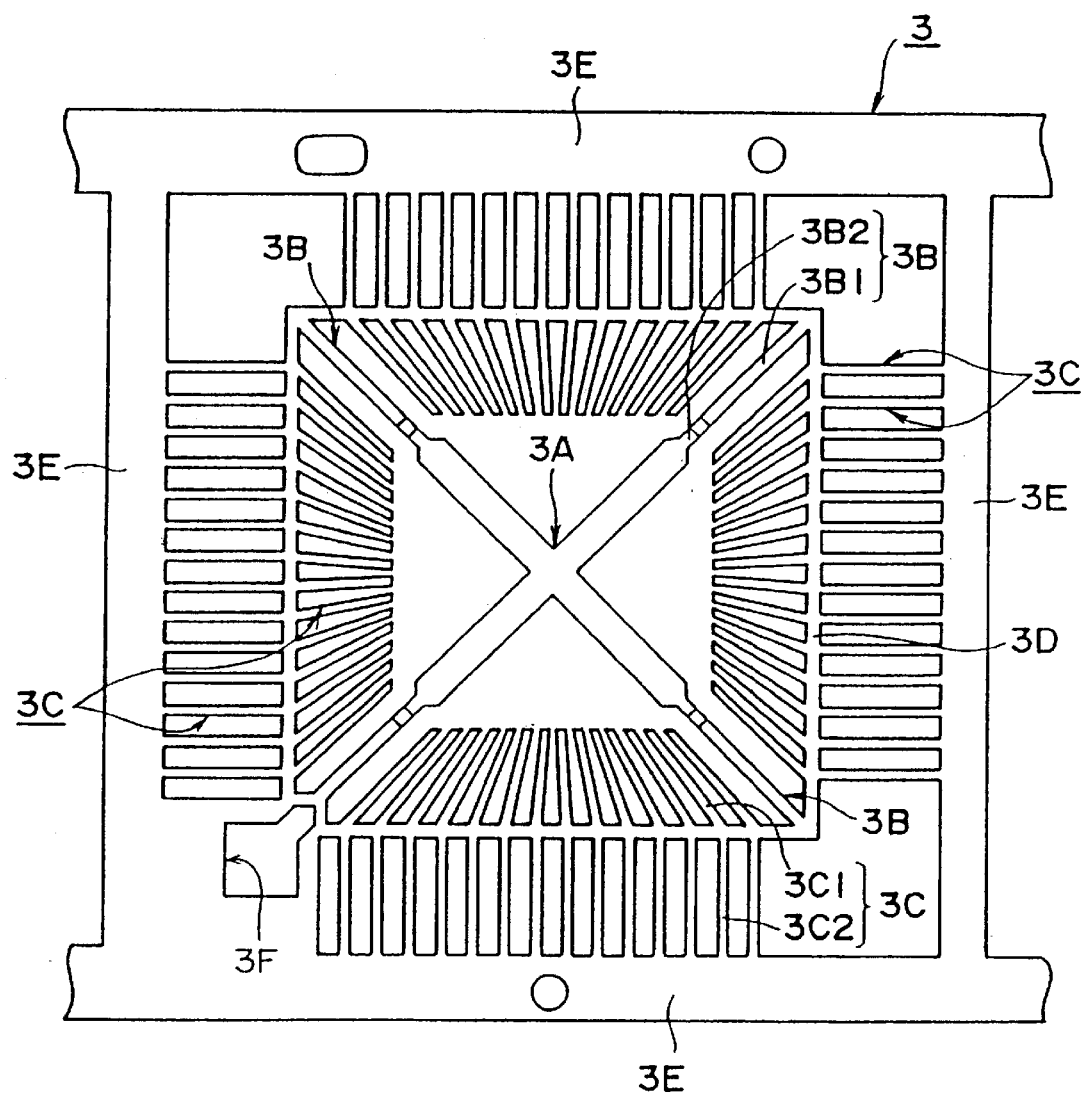
FIG. 10 is a plan view of a further lead frame to be used for the fabrication of the above-described plastic molded type semiconductor device.

The plastic molded type semiconductor device may also be prepared, as illustrated in FIG. 10, by a fabrication process using a lead frame 3 having a die pad 3A formed to have a X-shaped plane. Similar advantages can be obtained by this process employing such a lead frame 3.

(Second Embodiment)

Figure 11:
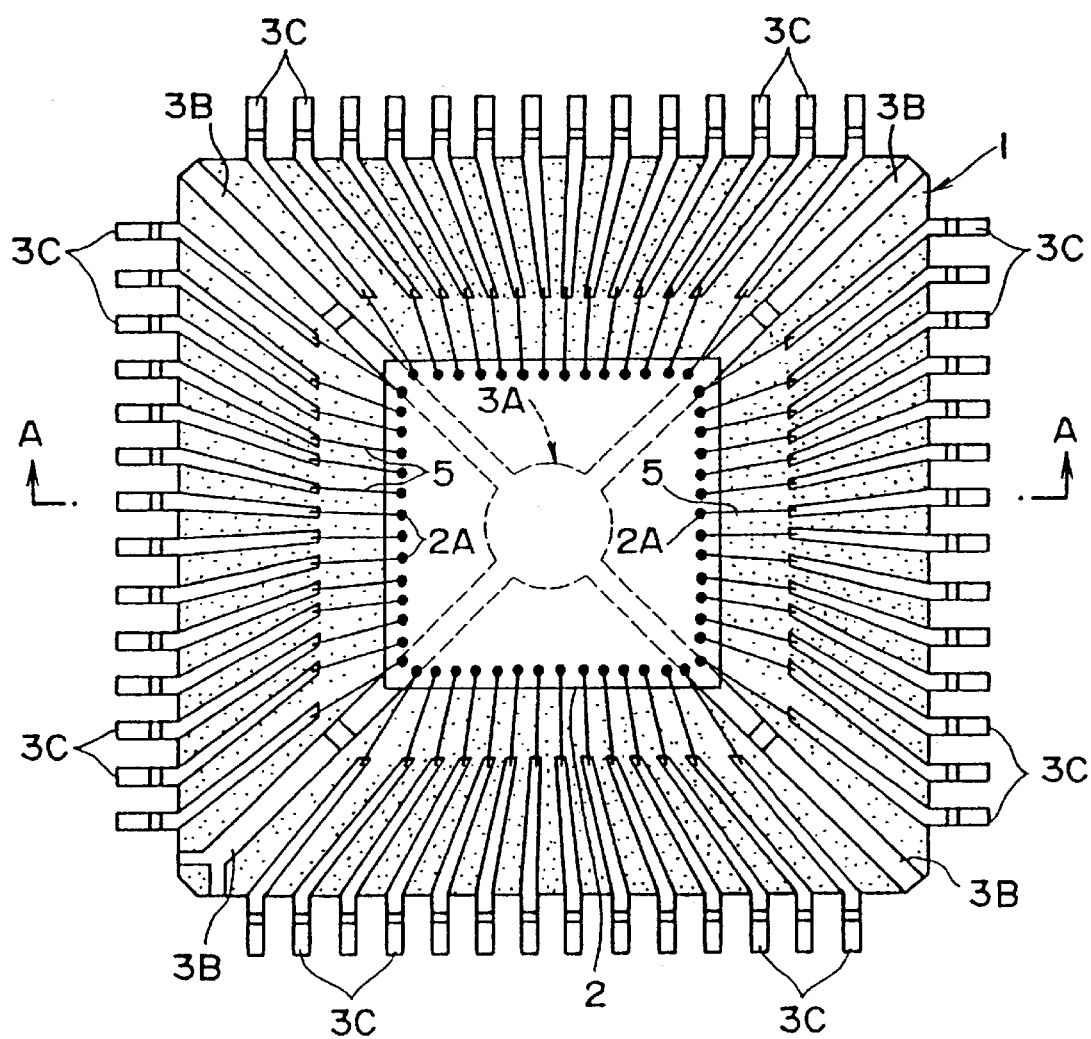
FIG. 11 is a plan view of a plastic molded type semiconductor device according to a second embodiment of the present invention from which the upper portion of a plastic mold has been removed.
Figure 12:
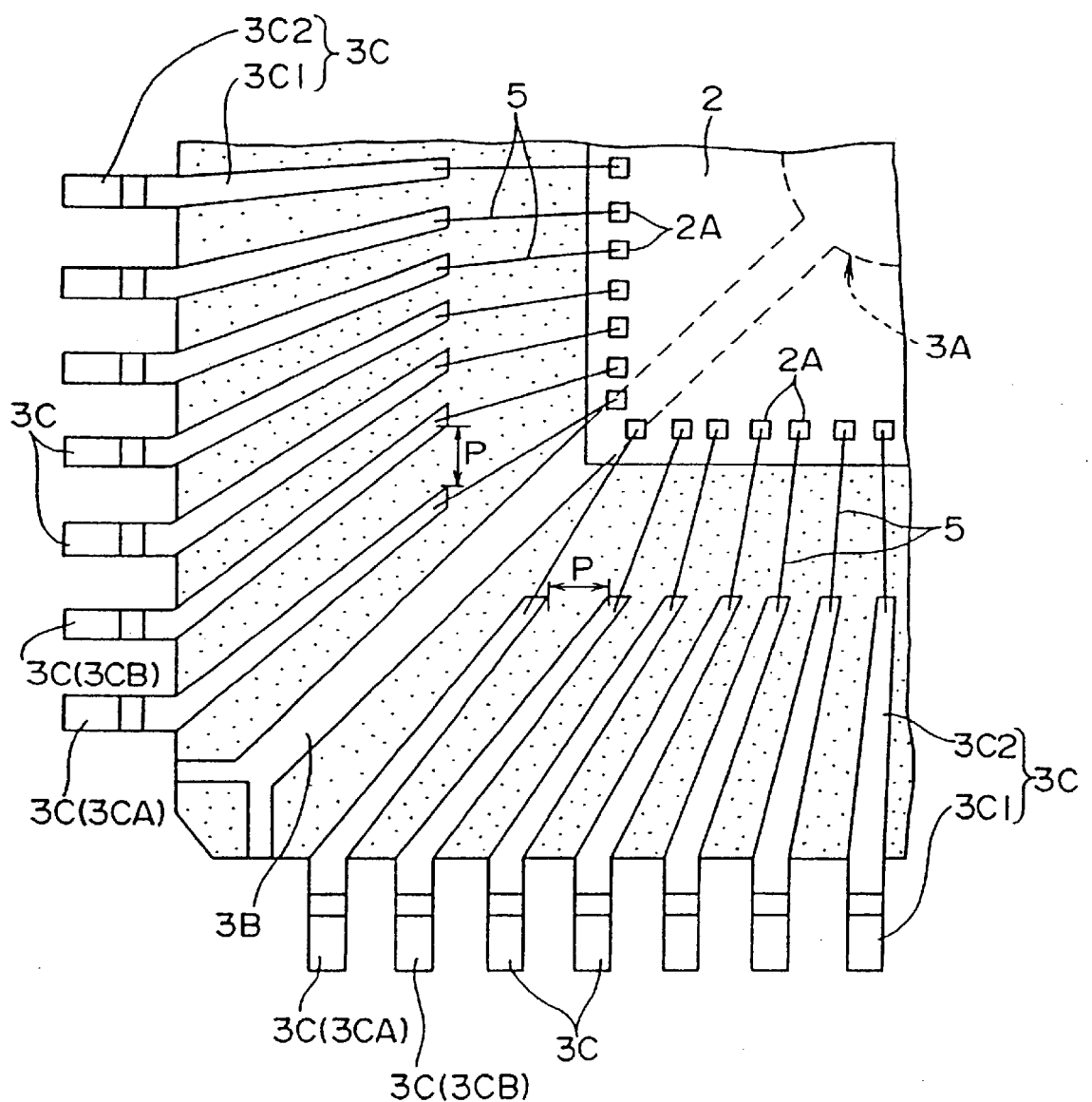
FIG. 12 is a fragmentary enlarged cross-sectional view of FIG. 11.

A plastic molded type semiconductor device according to this embodiment has, as illustrated in FIGS. 11 and 12, a semiconductor chip 2 mounted on a chip mounting surface (principal surface) of a die pad 3A.

The semiconductor chip 2 has a planar shape, for example, a square shape having an outside dimension of 9 [mm]×9 [mm]. On the principal surface of the semiconductor chip 2, a plurality of external terminals (bonding pads) 2A are arranged along each side of the principal surface.

In the outside region on each side of the semiconductor chip 2, a plurality of leads 3C are arranged. To the inner portions 3C1 of these plural leads 3C, a plurality of external terminals 2A disposed on the principal surface of the semiconductor chip 2 are electrically connected through bonding wires.

To the die pad 3A, four supporting leads 3B are coupled. These four supporting leads 3B serve to support the die pad 3A on the frame body of the lead frame under the condition of the lead frame. These four supporting leads 3B are disposed in the outside regions at the four corners of the semiconductor chip 2, respectively.

The semiconductor chip 2, die pad 3A, supporting leads 3B, inner portions 3C1 of the leads 3C, bonding wires 5 and the like are sealed by a plastic mold 1 formed by the transfer mold method.

The planar shape of the plastic mold 1 is, for example, a square shape having an outside dimension of 14 [mm]×14 [mm]. Outside on each side of the plastic mold 1, outer portions 3C2 of a plurality of leads 3C are arranged. The outer portions 3C2 of the plurality of leads 3C are arranged along each side of the plastic mold 1, for example, in the form of a gull-wing. The plastic mold semiconductor device according to this embodiment is thus fabricated to have a QFP (Quad Flat Package) structure.

The planar shape of the die pad 3A is, for example, in a circular form having an outside dimension of 2 to 4 [mm]φ. In other words, the die pad 3A is formed to have a smaller area than that of the semiconductor chip 2.

Each of the supporting leads 3B is, similar to the above first embodiment, formed of a lead portion (3B1) and another lead portion (3B2).

With regard to the plurality of leads 3C arranged in the outside region at each side of the semiconductor chip 2, a distance P from one end portion of a first-stage lead 3CA adjacent to the outside region at the corner of the semiconductor chip 2 to a second-stage lead 3CB adjacent to the first-stage lead 3CA is formed to be wider than the distance between any other two leads 3C. By forming, the distance P from one end portion of the first-stage lead 3CA adjacent to the outside region at the corner of the semiconductor chip 2 to the second-stage lead 3CB adjacent to the first-stage lead 3CA wider than the distance between any other two leads 3C, it is possible to widen the clearance between a bonding wire 5 connected to one end portion of the first-stage lead 3CA most closely adjacent to the outside region at the corner of the semiconductor chip 2 and another bonding wire 5 connected to one end portion of the second-stage lead 3CB adjacent to the first-stage lead 3CA.

Figure 13:
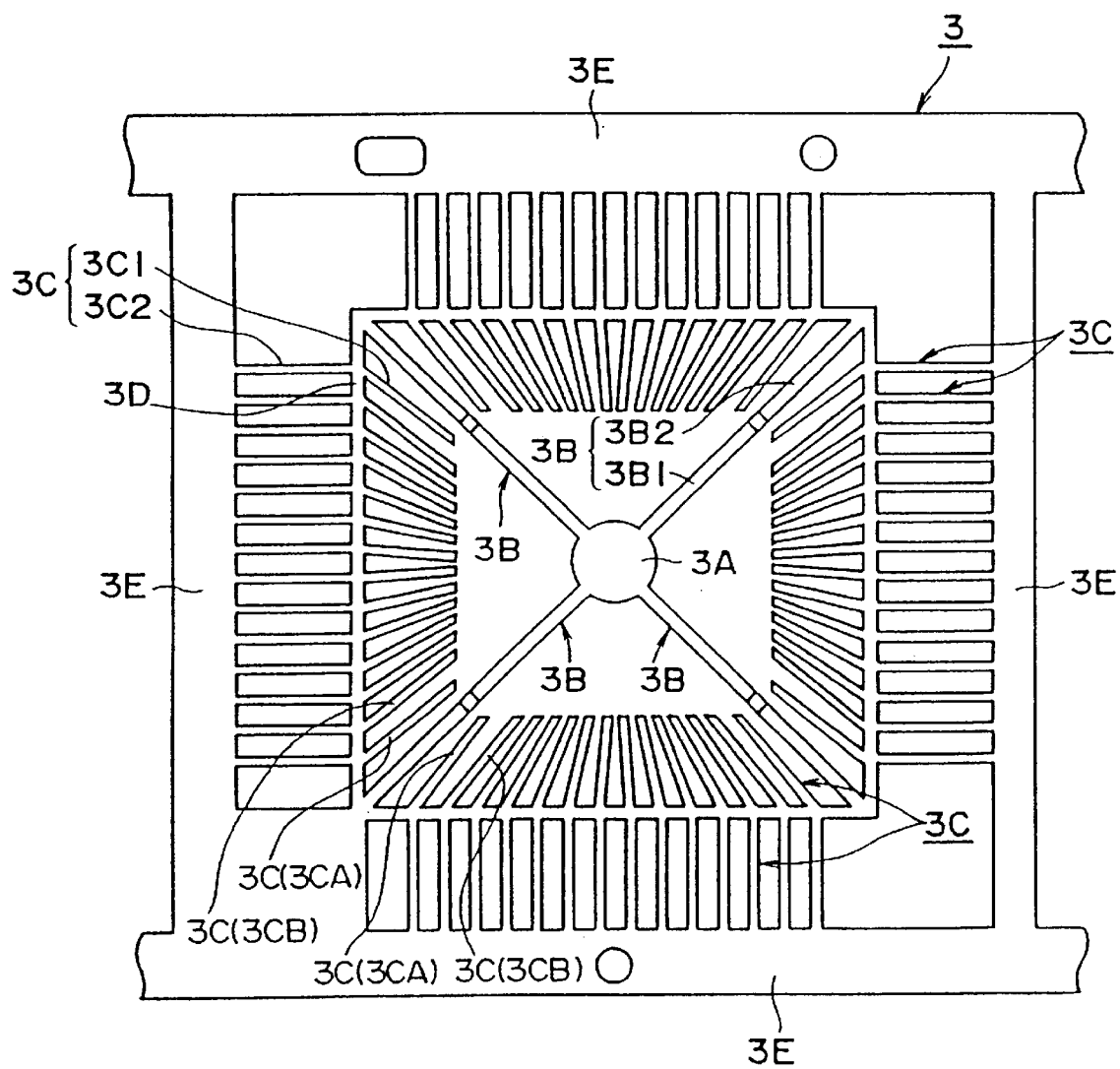
FIG. 13 is a plan view of a lead frame to be used for the fabrication of the above-described plastic molded type semiconductor device.

The plastic molded type semiconductor device as constructed above can be fabricated by a process using a lead frame 3 as illustrated in FIG. 13.

The lead frame 3 has a die pad 3A, four supporting leads 3B and a plurality of leads 3C arranged within a region defined by the frame body 3E. The die pad 3A is coupled to the frame body 3E through the four supporting leads 3B. The plurality of leads 3C are connected with the frame body 3E and, at the same time, are connected through a tie bar (dam bar) 3D to each other.

The frame body 3E has the shape of a square. Each of the plurality of leads 3C is arranged along a respective side of the frame body 3E and the four supporting leads 3B are arranged along the diagonal lines of the frame body 3E.

With regard to the plurality of leads 3C arranged along each side of the frame body 3E, the distance between one end portion of the first-stage lead 3CA most closely adjacent to the supporting lead 3B and one end portion of the second-stage lead 3CB adjacent to the first-stage lead 3CA is formed to be wider than the distance between any other two leads 3C at one end portion.

A description will next be made of the fabrication process used in the manufacture of the above-described plastic molded type semiconductor device.

First, a lead frame 3 as illustrated in FIG. 13 is prepared.

Then, a semiconductor chip 2 is mounted through an adhesive onto a chip mounting surface (principal surface) of a die pad 3A supported to a frame body 3E of the lead frame 3 through supporting leads 3B.

External terminals 2A of the semiconductor chip 2 are electrically connected with one end (one end of inner portions 3C1) of the leads 3C supported on the frame body of the lead frame 3 through bonding wires 5.

As described in the first embodiment, the lead frame 3 is disposed between a top portion 10A and a bottom portion 10B of a mold, and, at the same time, within a cavity of the mold, the semiconductor chip 2, the die pad 3A, supporting leads 3B, inner portions 3C1 of leads 3C, bonding wires and the like are disposed.

Then, a plastic mold 1 is formed by injecting a resin from a pot of the mold 1 through the runner and the gate. In this step, a supporting lead 3B is disposed in the outside region at a corner of the semiconductor chip 2 and a plurality of leads 3C and a plurality of bonding wires 5 are disposed in the outside region on each side of the semiconductor chip 2. In other words, the outside region at one corner of the semiconductor chip 2 is coarser than the outside region on one side of the semiconductor chip 2 so that the fluidity of the resin is higher in the outside region at one corner of the semiconductor chip 2 than it is in the outside region on one side of the semiconductor chip 2. Accordingly, the bonding wire 5 tends to move owing to the resin flowing into the outside region on one side of the semiconductor chip 2 from the outside region at one corner. Since the clearance between the bonding wire 5 connected to one end portion of the first-stage lead 3CA most closely adjacent to the outside region of the corner of the semiconductor chip 2 and another bonding wire 5 connected to one end portion of the second-stage lead 3CB adjacent to the first-stage lead 3CA is formed to be wide, even if the boding wire moves owing to the resin flowing into the outside region on one side of the semiconductor chip 2 from the outside region at its corner, a short circuit between these bonding wires 5 can be suppressed.

The plastic molded type semiconductor device as illustrated in FIG. 11 is substantially completed by cutting the supporting leads 3B and outer portions 3C2 of the leads 3C from the frame body 3E of the lead frame 3 and then forming the outer portions 3C2 of the leads 3C into a gull-wing shape.

As described, in accordance with this embodiment, a plastic molded type semiconductor device is produced in which a plurality of external terminals 2A are arranged on and along at least one side of the principal surface of the semiconductor chip 2; a plurality of leads 3C are arranged outside of and along one side of the semiconductor chip 2; one end portion of each of the plurality of the leads 3C is electrically connected through a bonding wire 5 with each of the plurality of external terminals 2A; and the semiconductor chip, leads, bonding wires and the like are sealed by a plastic mold 1. In this plastic molded type semiconductor device, the distance P between one end portion of the first-stage lead 3CA most closely adjacent to the outside region of the corner of the semiconductor chip 2 and one end portion of the second-stage lead 3CB adjacent to the first-stage lead 3CA is formed to be wider than the distance between any other two leads 3C at one end portion.

The above-described construction makes it possible to widen the distance between a bonding wire 5 connected to one end portion of the first-stage lead 3CA most closely adjacent to the outside region at the corner of the semiconductor chip 2 and another bonding wire 5 connected to one end portion of the second-stage lead 3CB adjacent to the first-stage lead 3CA. Therefore, in the fabrication of the plastic mold, even if movement of a bonding wire occurs owing to the resin flowing from the outside region at the corner of the semiconductor chip 2 to the outside region on one side, occurrence of a short circuit between bonding wires 5 can be prevented. As a result, the yield of the plastic molded type semiconductor device can be heightened.

When the outer dimension of the semiconductor chip 2 is reduced, this reduction is accompanied with an increase in the length of the bonding wire 5. Even if the distance P between one end portion of the first-stage lead 3CA and one end portion of the second stage lead 3CB is widened and the bonding wire 5 becomes longer with a decrease in the outer dimension of the semiconductor chip 2, a short circuit between a bonding wire 5 connected with the one end portion of the first-stage lead 3CA and another bonding wire 5 connected with the one end portion of the second-stage lead 3CB can be prevented.

Figure 14:
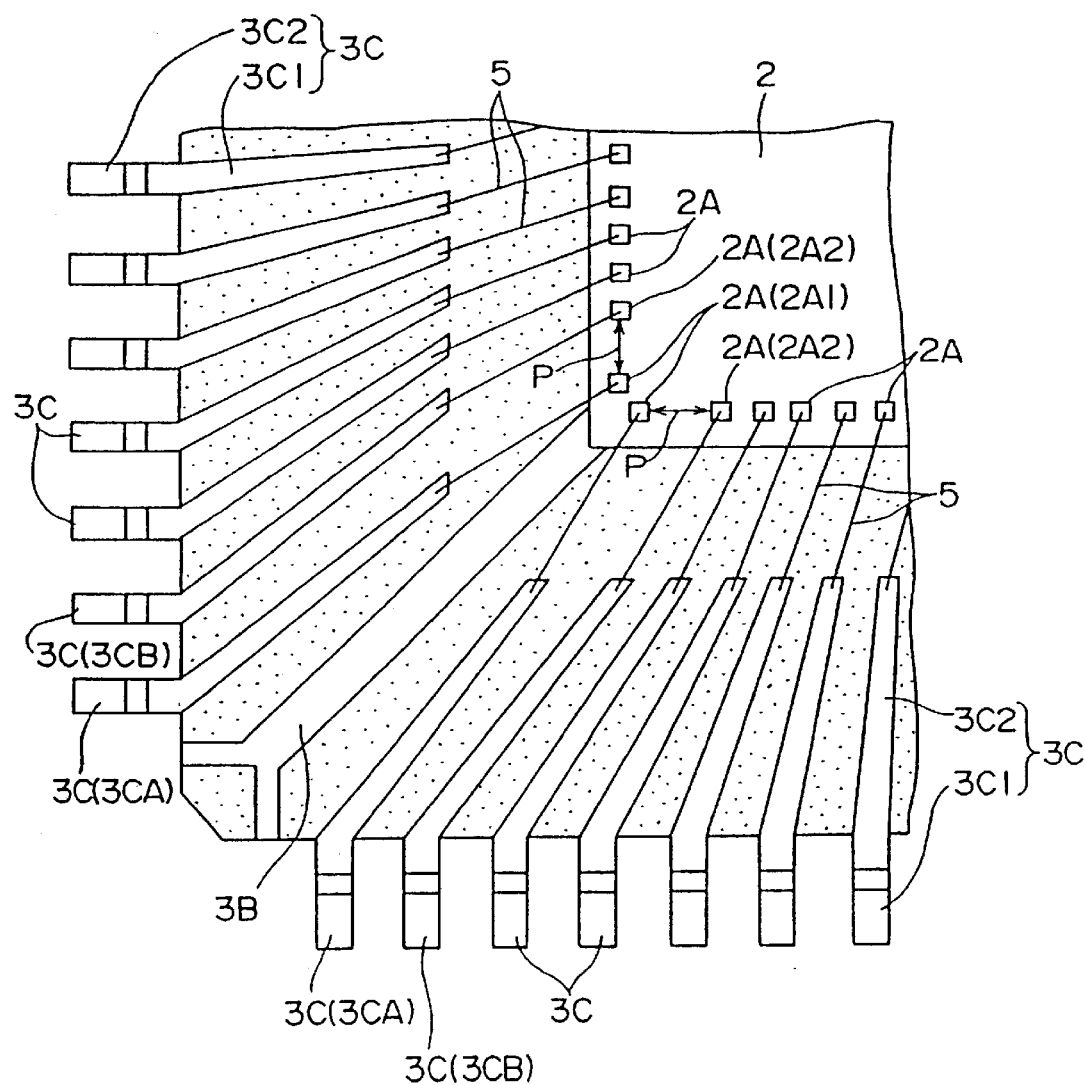
FIG. 14 is a fragmentary plan view illustrating a modification of the above-described plastic molded type semiconductor device.

Incidentally, among a plurality of external terminals 2A arranged on and along one side of the principal surface of the semiconductor chip 2, as illustrated in FIG. 14, it is also possible to widen the distance P between the external terminal 2A1 most closely adjacent to the corner of the semiconductor chip 2 and the external terminal 2A2 adjacent to the external terminal 2AI compared with the distance between any other two external terminals. Also, in this case, the distance between the bonding wire 5 connected to one end portion of the first-stage lead 3CA and another bonding wire 5 connected to one end portion of the second-stage lead 3CB can be widened so that the possibility of a short circuit between these bonding wires 5 can be suppressed.

Figure 15:
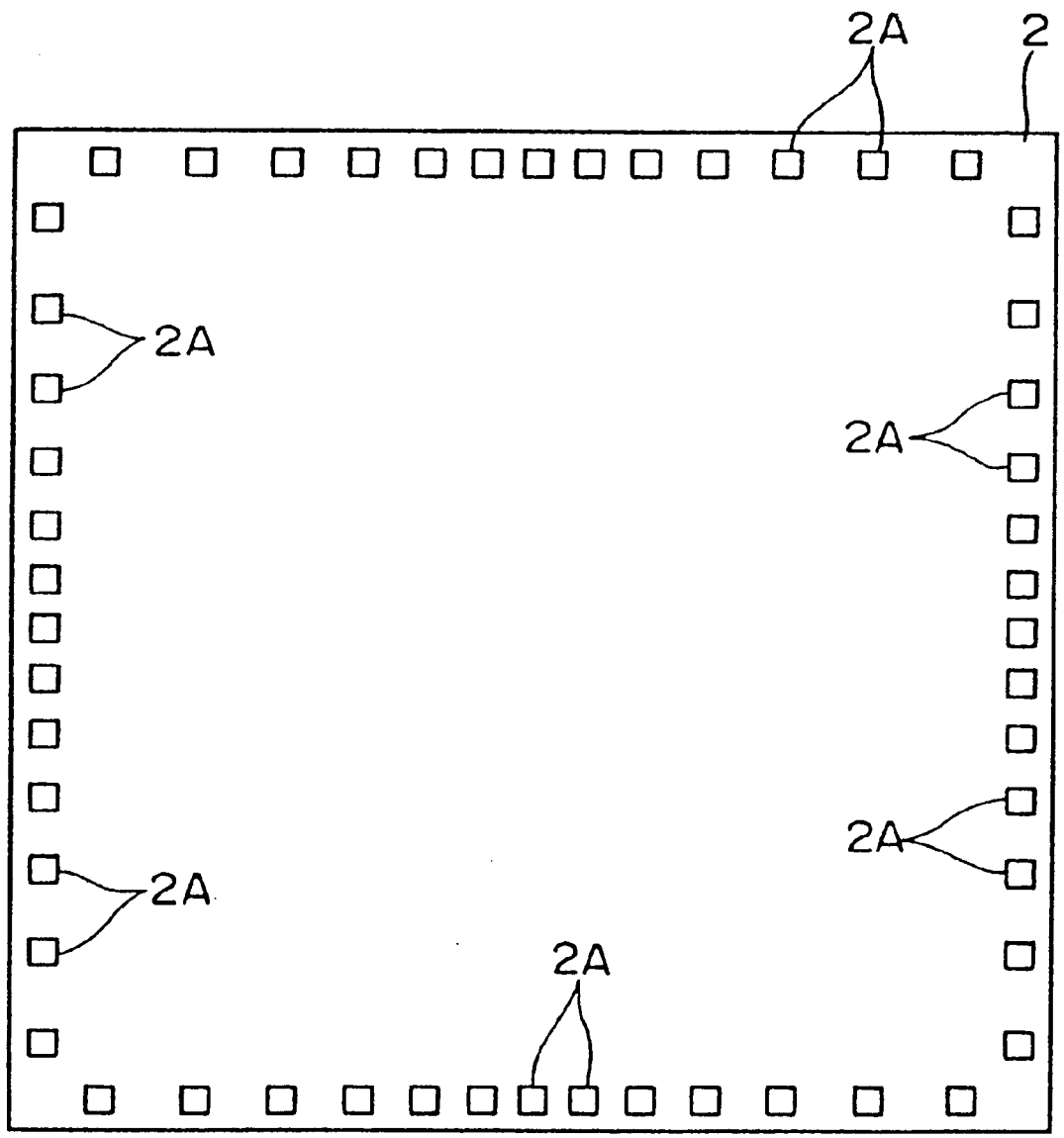
FIG. 15 is a plan view of a semiconductor chip illustrating a modification of the above-described plastic molded type semiconductor device.
Figure 16:
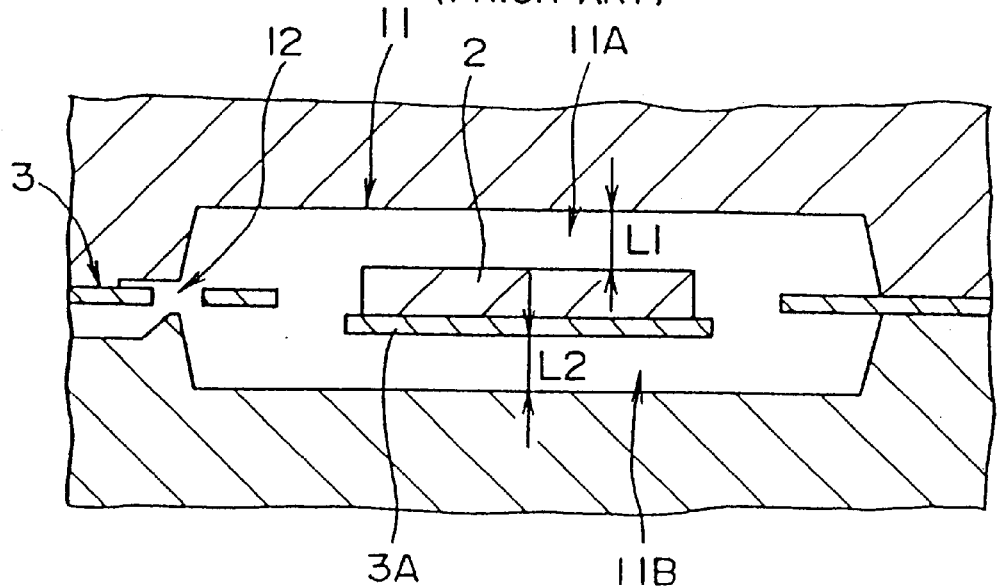
FIG. 16 is a schematic cross-sectional view for illustrating conventional problems.
Figure 17:
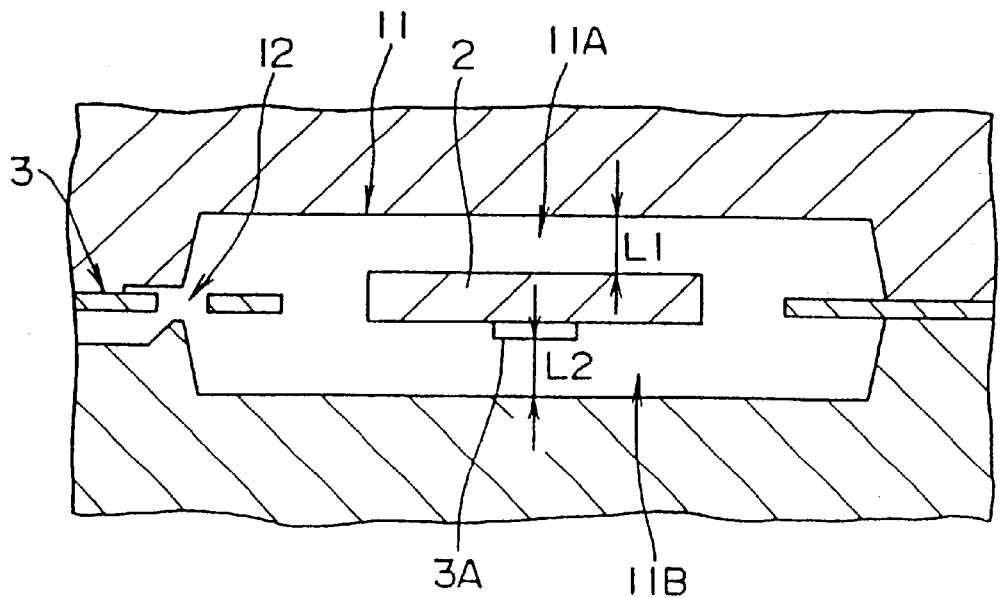
FIG. 17 is another schematic cross-sectional view illustrating conventional problems.
Figure 18:
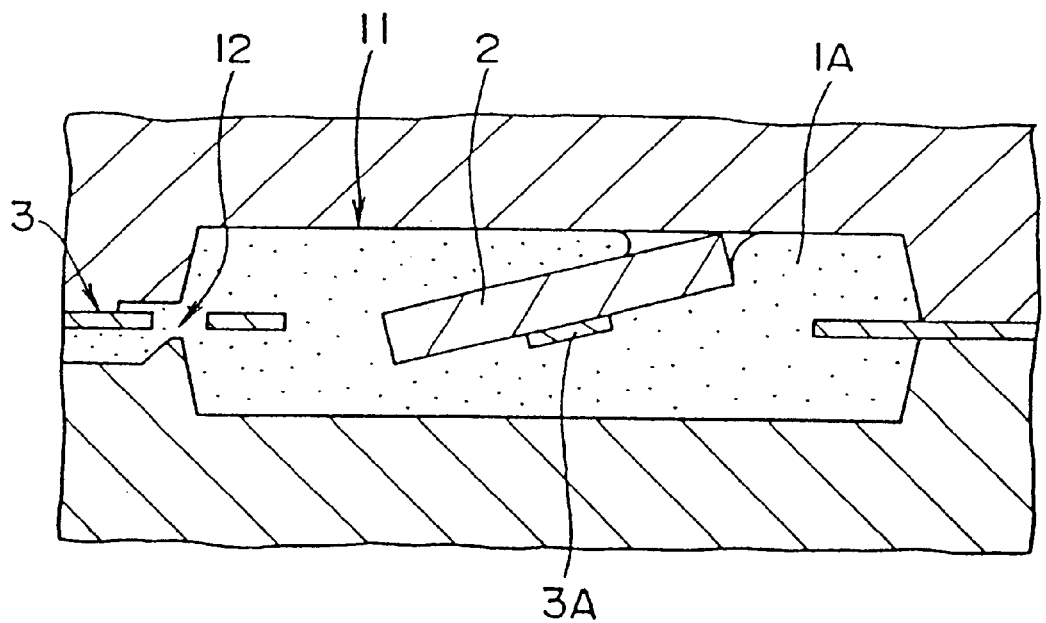
FIG. 18 is a further schematic cross-sectional view illustrating conventional problems.

Furthermore, the fluidity of the resin flowing from the outside region at the corner of the semiconductor chip 2 into the outside region on one side of the semiconductor chip gradually becomes lower toward the center of the outside region on one side of the semiconductor chip 2. As illustrated in FIG. 15, with regard to a plurality of external terminals 2A arranged on and along one side of the principal surface of the semiconductor chip 2, it is possible to widen each of the distances between two adjacent external terminals 2A stepwise from the center on one side of the semiconductor chip 2 toward the corner thereof. In this case, the possibility of a short circuit between any two adjacent bonding wires 5 can be suppressed without a marked increase in the outer dimension of the semiconductor chip, because the distance between bonding wires 5 can be widened gradually, according to the fluidity of the resin, from the center of one side of the semiconductor chip 2 toward its corner.

The invention by the present inventors has been described specifically with reference to the above embodiments. It should however be borne in mind that the present invention is not limited to or by those embodiments and can be modified to an extent not departing from the essential concepts of the present invention.

The present invention makes it possible to increase the yield of a plastic molded type semiconductor device.

What is claimed is:

1. A method of manufacturing a semiconductor device, comprising the steps of:
   (a) providing a semiconductor chip and a lead frame, said semiconductor chip having a plurality of semiconductor elements and bonding pads formed on a main surface thereof and a rear surface opposite to said main surface,
   said lead frame having a die pad, supporting leads continuously formed with said die pad and a plurality of leads, respective one ends of said plurality of leads being disposed to surround said die pad in a plane view, each of said supporting leads having an offset portion in such a manner that an upper surface of said die pad is positioned lower than an upper surface of each of the one ends of said plurality of leads in a thickness direction of said lead frame, said die pad having a size which is smaller than that of said semiconductor chip;

(b) mounting said semiconductor chip on said die pad, such that said rear surface of said semiconductor chip is bonded to said upper surface of said die pad and said one ends of said plurality of leads are disposed to surround said semiconductor chip and at a vicinity of a side surface of said semiconductor chip;

(c) electrically connecting said one ends of said plurality of leads with said bonding pads of said semiconductor chip by a plurality of bonding wires respectively;

(d) disposing said lead frame with said semiconductor chip at a mold die having an upper die and a lower die in such a manner that said semiconductor chip, said plurality of bonding wires, said die pad and said one ends of said plurality of leads are disposed in a cavity defined by said upper and lower dies of said mold die and said lead frame is clamped by said upper and lower dies of said mold die at portions which are opposite to said one ends of said plurality of leads, and in such a manner that a distance between a lower surface of said die pad and an inner side of said lower mold die is smaller than a distance between said main surface of said semiconductor chip and an inner side of said upper mold die in a thickness direction of said semiconductor chip, said mold die having a gate for injecting a resin material into said cavity at one side of said cavity of said mold die: and (e) injecting the resin material into said cavity of said mold die from said gate of said mold die by a transfer molding, to form a resin member, thereby sealing said semiconductor chip, said plurality of bonding wires, portions of said plurality of leads and said die pad by said resin member.

2. A method of manufacturing a semiconductor device according to claim 1, wherein each of said supporting leads has an inner portion and an outer portion which is continuously formed with said inner portion, wherein said supporting leads are clamped by said upper and lower dies of said mold die at a boundary between said inner and outer portions of each of said supporting leads in the step (d), and wherein said gate of said mold die is positioned at one of said supporting leads.

3. A method of manufacturing a semiconductor device according to claim 2, wherein said resin member is formed in a tetragonal shape, and wherein said outer portions of said supporting leads protrude outwardly from said resin member at four corners of said resin member.

4. A method of manufacturing a semiconductor device according to claim 3, wherein said gate of said mold die is positioned at one of said four corners of said resin member.

5. A method of manufacturing a semiconductor device according to claim 4, further comprising, after the step (e), a step of cutting said supporting leads to separate said outer portions of said supporting leads at said boundary thereof.

6. A method of manufacturing a semiconductor device according to claim 1, wherein said rear surface of said semiconductor chip is bonded to a surface of said die pad by an adhesive in the step (b).

7. A method of manufacturing a semiconductor device according to claim 6, wherein a part of said resin member contacts with said rear surface of said semiconductor chip except for areas to which said die pad is bonded.

8. A method of manufacturing a semiconductor device according to claim 6, wherein said die pad has a cross shape in plane view, and wherein a width of each of four strips defining said cross shape is wider than a width of each of said supporting leads.

* * * * *